United States Patent
Huang

(10) Patent No.: US 11,220,743 B2
(45) Date of Patent: Jan. 11, 2022

(54) COMPOSITE SUBSTRATE AND MANUFACTURING METHOD THEREOF

(71) Applicant: Industrial Technology Research Institute, Hsinchu (TW)

(72) Inventor: Chia-Yen Huang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 16/745,292

(22) Filed: Jan. 16, 2020

(65) Prior Publication Data

US 2020/0248304 A1 Aug. 6, 2020

Related U.S. Application Data

(60) Provisional application No. 62/799,717, filed on Jan. 31, 2019.

(30) Foreign Application Priority Data

Aug. 30, 2019 (TW) ................. 108131160

(51) Int. Cl.
*H01L 33/00* (2010.01)
*C23C 16/30* (2006.01)
(Continued)

(52) U.S. Cl.
CPC .......... *C23C 16/303* (2013.01); *C23C 16/56* (2013.01); *C30B 25/02* (2013.01); *C30B 29/403* (2013.01); *C30B 33/02* (2013.01); *H01L 33/0062* (2013.01)

(58) Field of Classification Search
CPC ..... C23C 16/303; C23C 16/56; C30B 29/403; C30B 33/02; C30B 25/02; H01L 33/0062
See application file for complete search history.

(56) References Cited

U.S. PATENT DOCUMENTS 6,442,184 B1 * 8/2002 Ota ...................... H01L 33/007
372/43.01
7,427,772 B2 9/2008 Chuo et al.
(Continued)

FOREIGN PATENT DOCUMENTS

| CN | 103700579 | 4/2014 |
|---|---|---|
| CN | 103824919 | 5/2014 |

(Continued)

OTHER PUBLICATIONS

Lisheng Zhang, et al., "High-quality AlN epitaxy on nano-patterned sapphire substrates prepared by nano-imprint lithography." Scientific Reports, Nov. 4, 2016, pp. 1-8.
(Continued)

*Primary Examiner* — Nathan L Van Sell
(74) *Attorney, Agent, or Firm* — JCIPRNET

(57) ABSTRACT

A composite substrate including a substrate and an aluminum nitride layer is provided. The aluminum nitride layer is disposed on a top surface of the substrate. Silicon is doped in the aluminum nitride layer to regulate residual stress, a film thickness of the aluminum nitride layer is less than 3.5 μm, a defect density of the aluminum nitride layer is less than or equal to $5 \times 10^9/cm^2$, and a root mean square roughness of the top surface, facing away from the substrate, of the aluminum nitride layer is less than 3 nm. A manufacturing method of a composite substrate is also provided.

12 Claims, 6 Drawing Sheets

(51) Int. Cl.
  *C23C 16/56* (2006.01)
  *C30B 29/40* (2006.01)
  *C30B 33/02* (2006.01)
  *C30B 25/02* (2006.01)

(56) References Cited

U.S. PATENT DOCUMENTS

| | | |
|---|---|---|
| 8,952,411 B2 | 2/2015 | Fu et al. |
| 8,981,403 B2 | 3/2015 | Shatalov et al. |
| 9,324,560 B2 | 4/2016 | Shatalov et al. |
| 9,330,906 B2 | 5/2016 | Shatalov et al. |
| 9,397,260 B2 | 7/2016 | Jain et al. |
| 9,397,281 B2 | 7/2016 | Fu et al. |
| 9,653,313 B2 | 5/2017 | Shatalov et al. |
| 9,680,061 B2 | 6/2017 | Jain et al. |
| 9,806,228 B2 | 10/2017 | Jain et al. |
| 9,978,845 B2 | 5/2018 | Han et al. |
| 10,032,956 B2 | 7/2018 | Shatalov et al. |
| 2007/0259534 A1 | 11/2007 | Reid et al. |
| 2012/0076968 A1* | 3/2012 | Dmitriev ............... C30B 25/02 428/64.1 |
| 2015/0279675 A1* | 10/2015 | Hanser ............. H01L 21/02433 438/478 |
| 2018/0047557 A1* | 2/2018 | Odnoblyudov ..... H01L 21/0243 |
| 2018/0108806 A1 | 4/2018 | Jain et al. |

FOREIGN PATENT DOCUMENTS

| | | |
|---|---|---|
| CN | 105390375 | 3/2016 |
| CN | 103548116 | 11/2016 |
| CN | 106233429 | 12/2016 |
| CN | 107910415 | 4/2018 |
| CN | 108269887 | 7/2018 |
| TW | I577630 | 4/2017 |

OTHER PUBLICATIONS

"Office Action of China Counterpart Application", dated Dec. 2, 2020, p. 1-p. 7.

* cited by examiner

COMPOSITE SUBSTRATE AND MANUFACTURING METHOD THEREOF

CROSS-REFERENCE TO RELATED APPLICATION

This application claims the priority benefits of U.S. provisional application Ser. No. 62/799,717, filed on Jan. 31, 2019, and Taiwan application serial no. 108131160, filed on Aug. 30, 2019. The entirety of each of the above-mentioned patent applications is hereby incorporated by reference herein and made a part of this specification.

TECHNICAL FIELD

The technical field relates to a substrate, in particular to a composite substrate.

BACKGROUND

In an epitaxy manufacturing process of a light-emitting diode, if a semiconductor layer such as an N-type or P-type III-V semiconductor layer or a quantum well layer is to be grown on a substrate, it is necessary to solve a problem that the substrate (such as a sapphire substrate) and the semiconductor layer are different in a lattice constant. The lattice constant difference will lead to an epitaxy defect, and then affect a luminous efficiency of the light-emitting diode. In order to solve the foregoing problem of the lattice constant difference, a buffer layer with a small lattice constant difference is generally formed generally before the growth of the semiconductor layer.

On the other hand, in order to improve a quantum efficiency of the light-emitting diode, a patterned sapphire substrate (PSS) is developed, so as to increase a light extraction rate by means of light scattering of a protruding pattern on the substrate. At this time, if an aluminum nitride layer is used as the buffer layer, high activity and low surface mobility of aluminum atoms will lead to problems such as high dislocation density, high sewing thickness, rough surface or cracking of the aluminum nitride layer.

SUMMARY

One embodiment of the disclosure provides a composite substrate, including a substrate and an aluminum nitride layer. The aluminum nitride layer is disposed on a top surface of the substrate. Silicon is doped in the aluminum nitride layer to regulate residual stress, a film thickness of the aluminum nitride layer is less than 3.5 µm, a defect density of the aluminum nitride layer is less than or equal to $5\times10^9/cm^2$, and a root mean square roughness of the top surface, facing away from the substrate, of the aluminum nitride layer is less than 3 nm.

One embodiment of the disclosure provides a manufacturing method of a composite substrate, including: preparing a substrate and forming an aluminum nitride layer on a top surface of the substrate. Silicon is doped in the aluminum nitride layer to regulate residual stress, a film thickness of the aluminum nitride layer is less than 3.5 µm, a defect density of the aluminum nitride layer is less than or equal to $5\times10^9/cm^2$, and a root mean square roughness of the top surface, facing away from the substrate, of the aluminum nitride layer is less than 3 nm.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
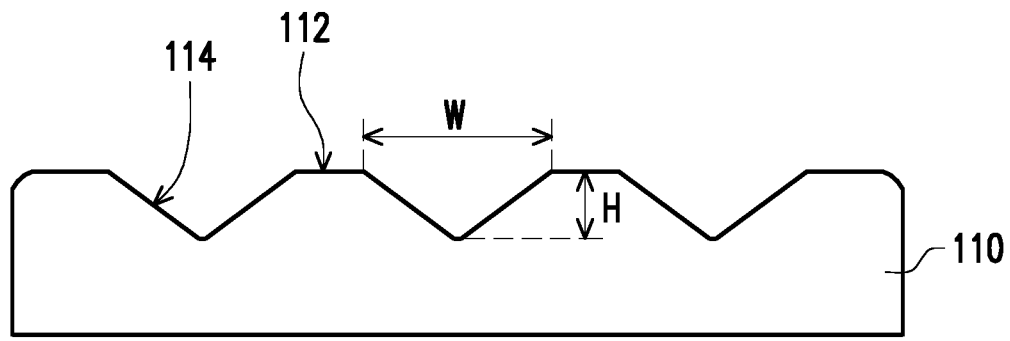
FIG. 1A and FIGS. 2 to 5 are cross-sectional diagrams of a manufacturing flow of a composite substrate according to one embodiment of the disclosure.
Figure 1B:
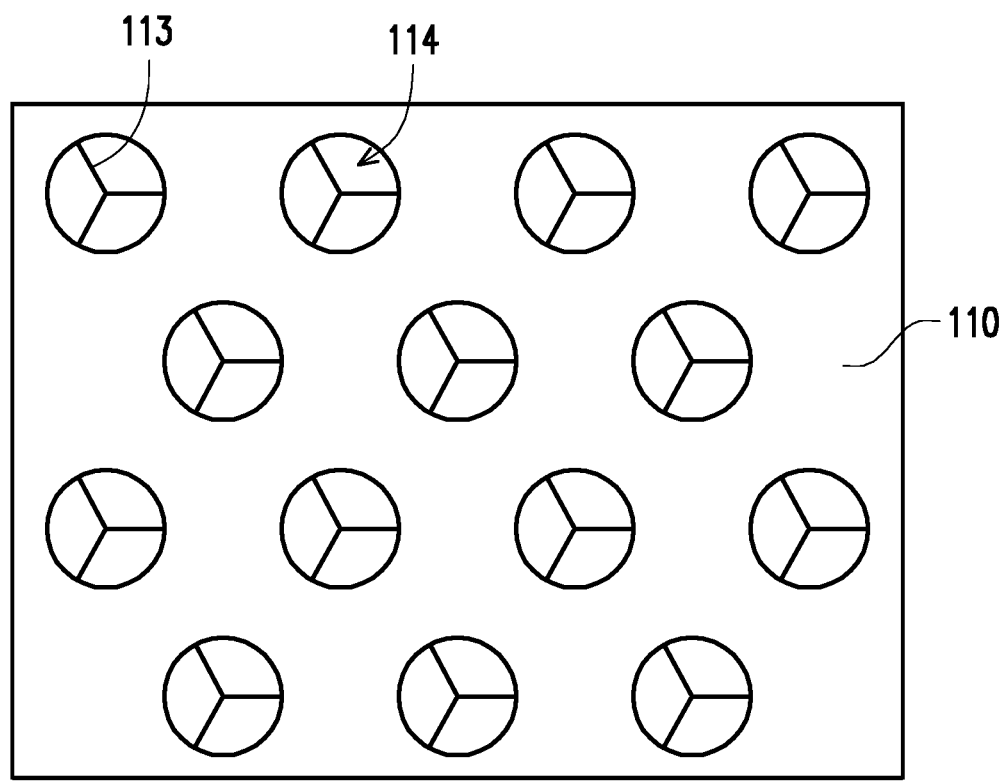
FIG. 1B is a top view of the substrate in FIG. 1A.

FIG. 1A and FIGS. 2 to 5 are cross-sectional diagrams of a manufacturing flow of a composite substrate according to one embodiment of the disclosure, and FIG. 1B is a top view of the substrate in FIG. 1A. A manufacturing method of a composite substrate of the present embodiment includes the following steps. Firstly, referring to FIGS. 1A and 1B, a substrate 110 is prepared. A top surface 112 of the substrate 110 includes a plurality of nano-patterned recesses 114, and these nano-patterned recesses 114 are separated from each other. In the present embodiment, the substrate 110 is, for example, a sapphire substrate, and a depth H of the nano-patterned recesses 114 is in a range of 150 nm to 1.5 µm, preferably 100 nm to 1 µm, more preferably 200 nm to 500 nm. Furthermore, a width W of these nano-patterned recesses is in a range of 200 nm to 1.5 µm, preferably 300 nm to 800 nm, more preferably 400 nm to 600 nm. In the present embodiment, the method for forming the nano-patterned recesses 114 is, for example, to manufacture these nano-patterned recesses 114 by performing wet etching on the top surface of the unprocessed sapphire substrate, so that etching liquid may etch the sapphire substrate along a plurality of different crystal faces, and boundary lines 113 for the crystal faces are produced between adjacent crystal faces. In the present embodiment, the plurality of crystal faces of the nano-patterned recesses 114 form an inverted pyramid shape (for example, three crystal faces form an inverted triangular pyramid shape), and the plurality (at least three, the present embodiment takes three boundary lines as an example) of boundary lines 113 are converged at a bottommost vertex of the inverted pyramid shape. In the present embodiment, side walls of the nano-patterned recesses 114 are of an inverted pyramid shape, and bottoms of the nano-patterned recesses 114 are of a tip shape. However, in other embodiments, the method for forming the nano-patterned recesses 114 may be dry etching, and the nano-patterned recesses 114 formed by this method do not have the foregoing boundary lines 113.

In the present embodiment, these nano-patterned recesses 114 are regularly arranged on the top surface 112 of the substrate 110. However, in other embodiments, these nano-patterned recesses 114 may also be arranged irregularly.

Figure 2:
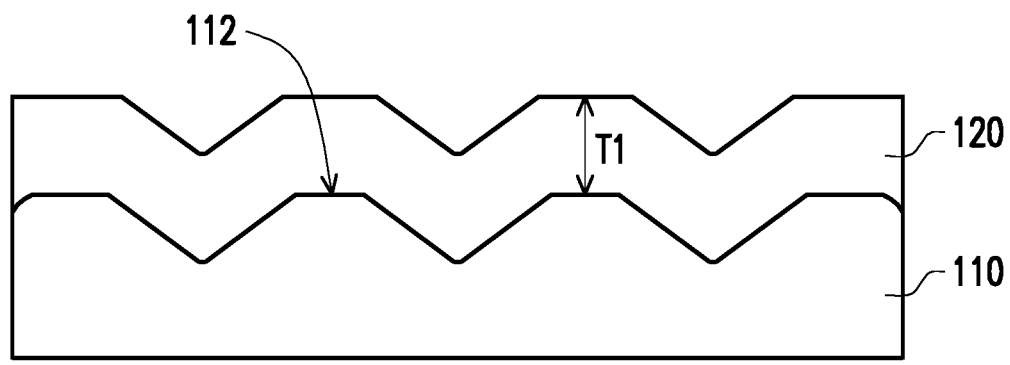

Next, referring to FIG. 2, a first aluminum nitride layer 120 is formed on the top surface 112 of the substrate 110. The method for forming the first aluminum nitride layer 120 may be metal organic chemical vapor deposition (MOCVD), sputtering, or hydride vapor phase epitaxy (HVPE). In the present embodiment, a film thickness T1 of the first aluminum nitride layer 120 is greater than the depth H of the nano-patterned recesses 114.

Figure 3:
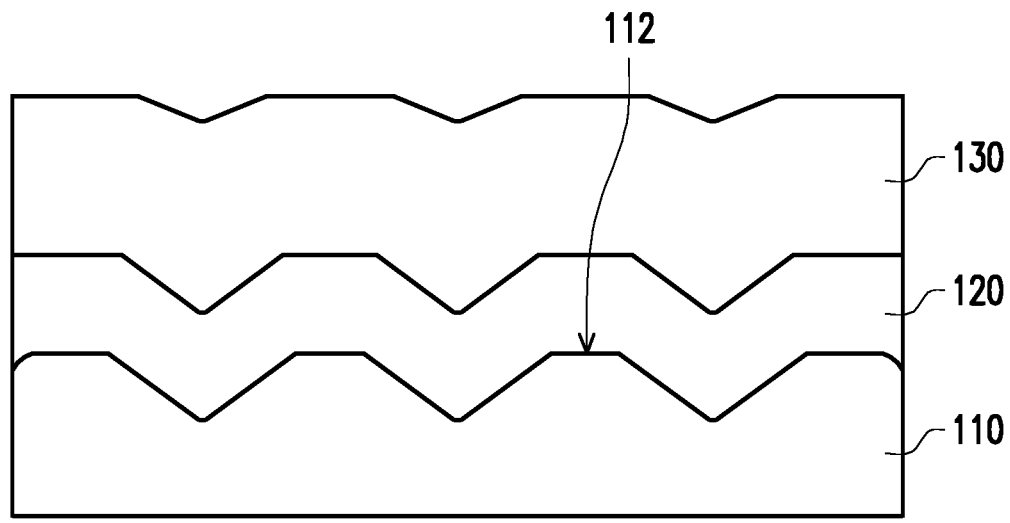

Then, referring to FIG. 3, a planarization layer 130 is formed on the first aluminum nitride layer 120. After the planarization layer 130 covers the first aluminum nitride layer 120, a top surface of the planarization layer 130 is flatter than a top surface of the first aluminum nitride layer 120. In the present embodiment, a material of the planarization layer 130 is, for example, spin-on glass. However, in other embodiments, the material of the planarization layer 130 may also be a polymer.

Figure 4:
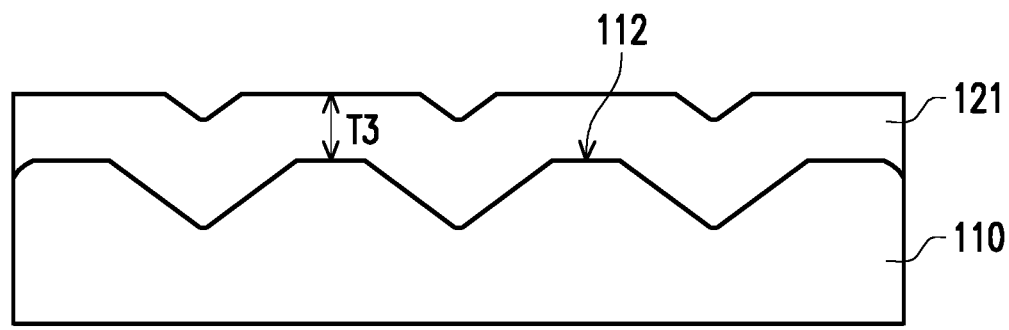

Thereafter, referring to FIG. 4, the material of the planarization layer 130 is gradually removed. When the material of the planarization layer 130 is gradually removed to a bottom of the planarization layer 130, part of the first aluminum nitride layer 120 may also be gradually removed to flatten the first aluminum nitride layer 120 and form a first aluminum nitride layer 121 having a relatively flat top surface. In the present embodiment, the method for gradually removing the material of the planarization layer 130 is dry etching, such as an inductively coupled plasma (ICP) etching method, and etching conditions may be selected to make the etching rate of planarization layer 130 substantially the same as the etching rate of the first aluminum nitride layer 121. In this way, when all the materials of the planarization layer 130 are etched away, part of the first aluminum nitride layer 120 will be etched at this time to enable the appearance of the top surface of the planarization layer 130 to be transferred to the top surface of the first aluminum nitride layer 121 to form the relatively flat first aluminum nitride layer 121. However, in other embodiments, the method for gradually removing the material of the planarization layer 130 may also be mechanical polishing.

In addition, after the material of the planarization layer 130 is gradually removed, annealing, such as high-temperature annealing at 1,500° C. or above, may be performed on the flattened first aluminum nitride layer 121. The high-temperature annealing can lead to recrystallization of the first aluminum nitride layer 121 and greatly reduce a dislocation density in a film of the first aluminum nitride layer 121.

Figure 5:
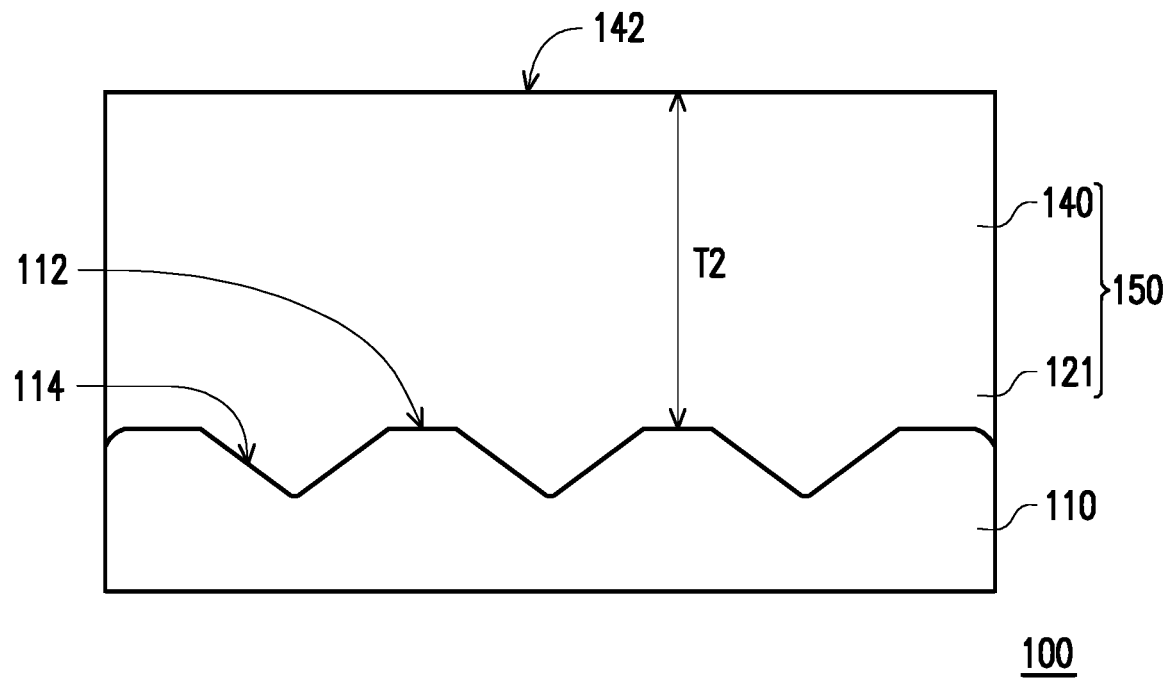

Thereafter, referring to FIG. 5, a second aluminum nitride layer 140 is formed on the flattened first aluminum nitride layer 121. For example, the second aluminum nitride layer 140 is formed by the MOCVD. Since the second aluminum nitride layer 140 is formed on the flattened first aluminum nitride layer 121, a root mean square roughness of a top surface 142, facing away from the substrate 110, of the second aluminum nitride layer 140 is less than 3 nm. Since the second aluminum nitride layer 140 is formed on the first aluminum nitride layer 121 having the relatively flat top surface, a sewing thickness of the second aluminum nitride layer 140 can be relatively small. In the present embodiment, a film thickness T2 of an aluminum nitride layer 150 formed by the first aluminum nitride layer 121 and the second aluminum nitride layer 140 is less than 3.5 μm. In addition, since the second aluminum nitride layer 140 is formed on the first aluminum nitride layer 121 having the relatively flat top surface, the aluminum nitride layer 150 may have no holes or tiny holes, and the aluminum nitride layer 150 has a defect density less than or equal to $5 \times 10^9$/cm$^2$ and high crystal quality. The aluminum nitride layer 150 having tiny holes means that the aluminum nitride layer 150 has a plurality of holes therein, and each hole is in a size less than 50 nm in at least one direction of a horizontal direction parallel to the substrate 110 and a vertical direction perpendicular to the substrate 110.

In the present embodiment, the aluminum nitride layer 150 formed after the step of FIG. 5 is disposed on the top surface 112 of the substrate 110, and a root mean square roughness of a top surface (i.e., the top surface 142 of the second aluminum nitride layer 140), with back to the substrate 110, of the aluminum nitride layer 150 is less than 3 nm. As a result, the composite substrate 100 including the substrate 110 and the aluminum nitride layer 150 is formed. An N-type semiconductor layer, a quantum well layer and a P-type semiconductor layer of a light-emitting diode can be formed on the composite substrate 100, which contributes to improving the crystallization quality of the N-type semiconductor layer, the quantum well layer and the P-type semiconductor layer.

In the present embodiment, when the second aluminum nitride layer 140 is formed on the first aluminum nitride layer 121, silicon may be doped in the second aluminum nitride layer 140 to regulate residual stress. In the present embodiment, a doping concentration of silicon in the second aluminum nitride layer 140 is more than $2 \times 10^{17}$ cm$^{-3}$ and less than $1 \times 10^{20}$ cm$^{-3}$. In a preferred embodiment, the doping concentration of silicon in the second aluminum nitride layer 140 is more than $2 \times 10^{18}$ cm$^{-3}$ and less than $5 \times 10^{19}$ cm$^{-3}$. In this embodiment, the in-plane lattice constant of the second aluminum nitride layer 140 is larger than the in-plane lattice constant of the first aluminum nitride layer 121 because of silicon doping in the second aluminum nitride layer 140. Besides, in this embodiment, a silicon concentration of the aluminum nitride layer 150 at a side adjacent to the substrate 110 (i.e. a bottom side in the figure) is lower than a silicon concentration of the aluminum nitride layer 150 at a side far away from the substrate 110 (i.e. a top side in the figure). In this embodiment, the distance between the highest silicon concentration position (e.g. the position at the bottom side of the second aluminum nitride layer 140) in the aluminum nitride layer to the top surface to the substrate 110 is higher than 600 nm in a vertical direction perpendicular to the substrate 110.

In the composite substrate 100 and the manufacturing method thereof of the present embodiment, since the plurality of nano-patterned recesses 114 separated from each other are used on the top surface 112 of the substrate 110, that is, a nano-patterned substrate having a recessed nano pattern is used to replace a traditional patterned substrate having a protruding nano pattern, thereby greatly reducing an intrinsic grain sewing difficulty of aluminum nitride epitaxy. In addition, in the present embodiment, the method for forming the nano-patterned recesses 114 may be the wet etching method, which contributes to improving the quality of epitaxy directly formed on aluminum nitride. Furthermore, by the method for forming the planarization layer 130 and then gradually removing the material of the planarization layer 130, the surface of the first aluminum nitride layer 121 is flattened, and by the annealing on the flattened first aluminum nitride layer 121, the crystal quality of the aluminum nitride layer 150 can be further improved, the sewing difficulty can be reduced, and a design space of the composite substrate 100 is expanded.

Figure 6A:
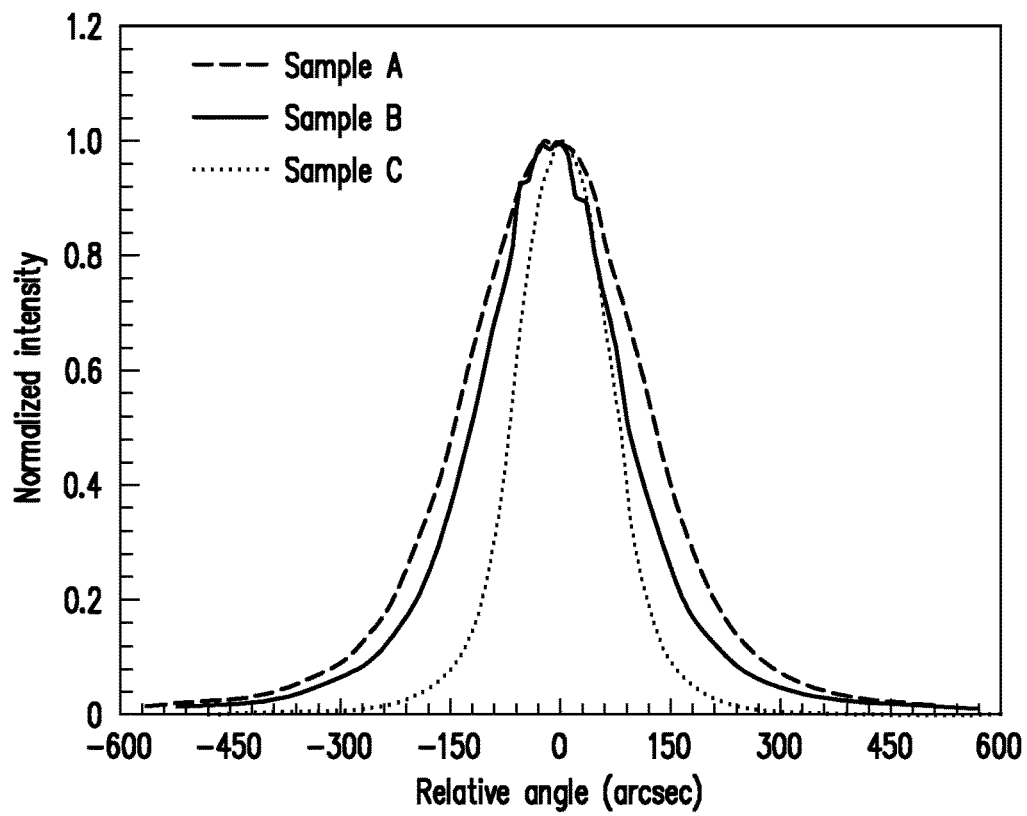
FIG. 6A is a (002) X-ray rocking curve of three different samples of the composite substrate of FIG. 5 after the growth of a second aluminum nitride layer.
Figure 6B:
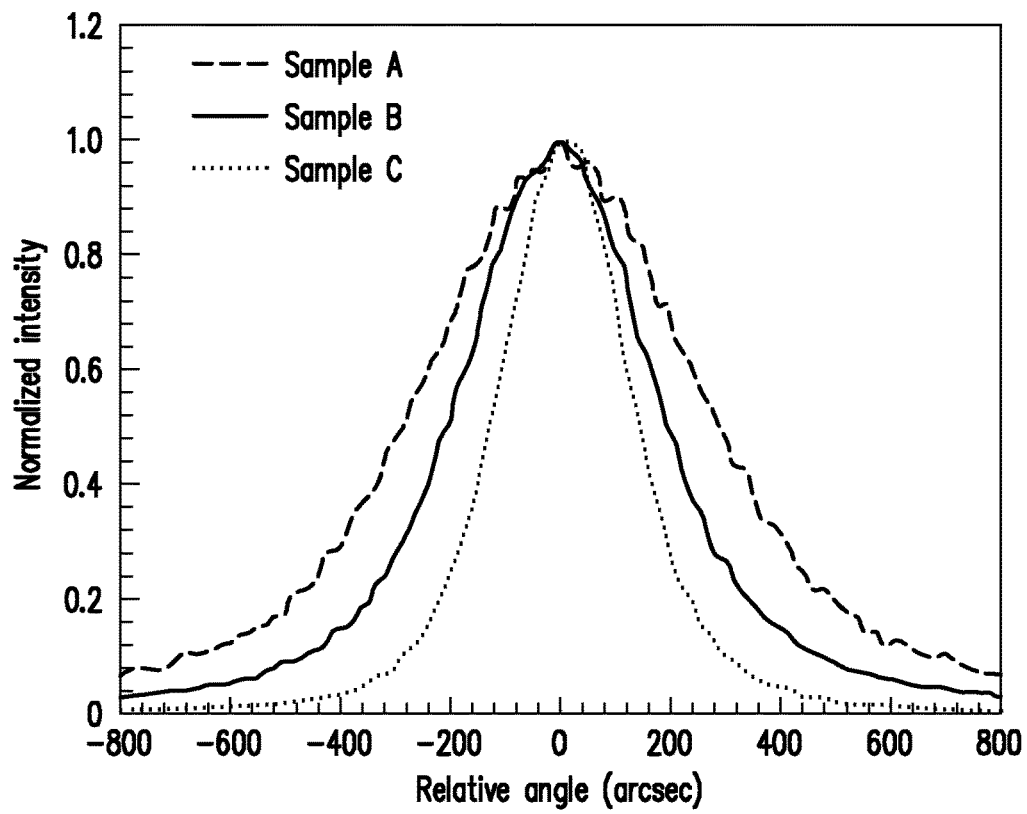
FIG. 6B is a (102) X-ray rocking curve of three different samples of the composite substrate of FIG. 5 after the growth of a second aluminum nitride layer.

FIG. 6A is a (002) X-ray rocking curve of three different samples of the composite substrate of FIG. 5 after the growth of the second aluminum nitride layer, and FIG. 6B is a (102) X-ray rocking curve of three different samples of the composite substrate of FIG. 5 after the growth of the second aluminum nitride layer. A sample A, a sample B and a sample C are used here to verify the crystal quality of the present embodiment in FIGS. 4, 5, 6A and 6B. The sample A is a sample that the first aluminum nitride layer 121 is formed on the substrate 110 but is not annealed, and has a film thickness T3 of 300 nm. The sample B is a sample that the first aluminum nitride layer 121 is formed on the substrate 110 and annealed, and has a film thickness T3 of 300 nm. The sample C is a sample that the first aluminum nitride layer 121 is formed on the substrate 110 and annealed, and has a film thickness T3 of 600 nm. When the second aluminum nitride layer 140 is not formed on the sample A, the sample B and the sample C, the FWHMs (full width at half maximum) of the (002) X-ray rocking curve are 50 arcsec, 30 arcsec and 70 arcsec, respectively, and the FWHMs of the (102) X-ray rocking curve are more than 2000 arcsec, 392 arcsec and 371 arcsec, respectively. The (002) X-ray rocking curve and the (102) X-ray rocking curve after the second aluminum nitride layer 140 is formed on the sample A, the sample B and the sample C are respectively as shown in FIGS. 6A and 6B. After the second aluminum nitride layer 140 is formed on the sample A, the sample B and the sample C, the FWHMs of the (002) X-ray rocking curve are 420 arcsec, 216 arcsec and 144 arcsec, respectively, and the FWHMs of the (102) X-ray rocking curve are 560 arcsec, 400 arcsec and 280 arcsec, respectively. In the present embodiment, the FWHM of the (002) X-ray rocking curve of the aluminum nitride layer 150 is less than or equal to 216 arc arcsec (e.g., less than 150 arcsec), and the FWHM of the (102) X-ray rocking curve of the aluminum nitride layer 150 is less than or equal to 400 arcsec (e.g., less than 350 arcsec). The above experimental data may verify that the annealing can effectively improve the crystal quality of the first aluminum nitride layer 121 before the growth of the second aluminum nitride layer 140, and an enough thickness of the first aluminum nitride layer 121 contributes to further improving the crystal quality of the second aluminum nitride layer 140. In the present embodiment, finally, the FWHM of the (102) X-ray rocking curve of the aluminum nitride layer 150 of the composite substrate 100 may be 260 arcsec, and the dislocation density is calculated to be about $4 \times 10^8$ cm$^{-2}$.

Figure 7:
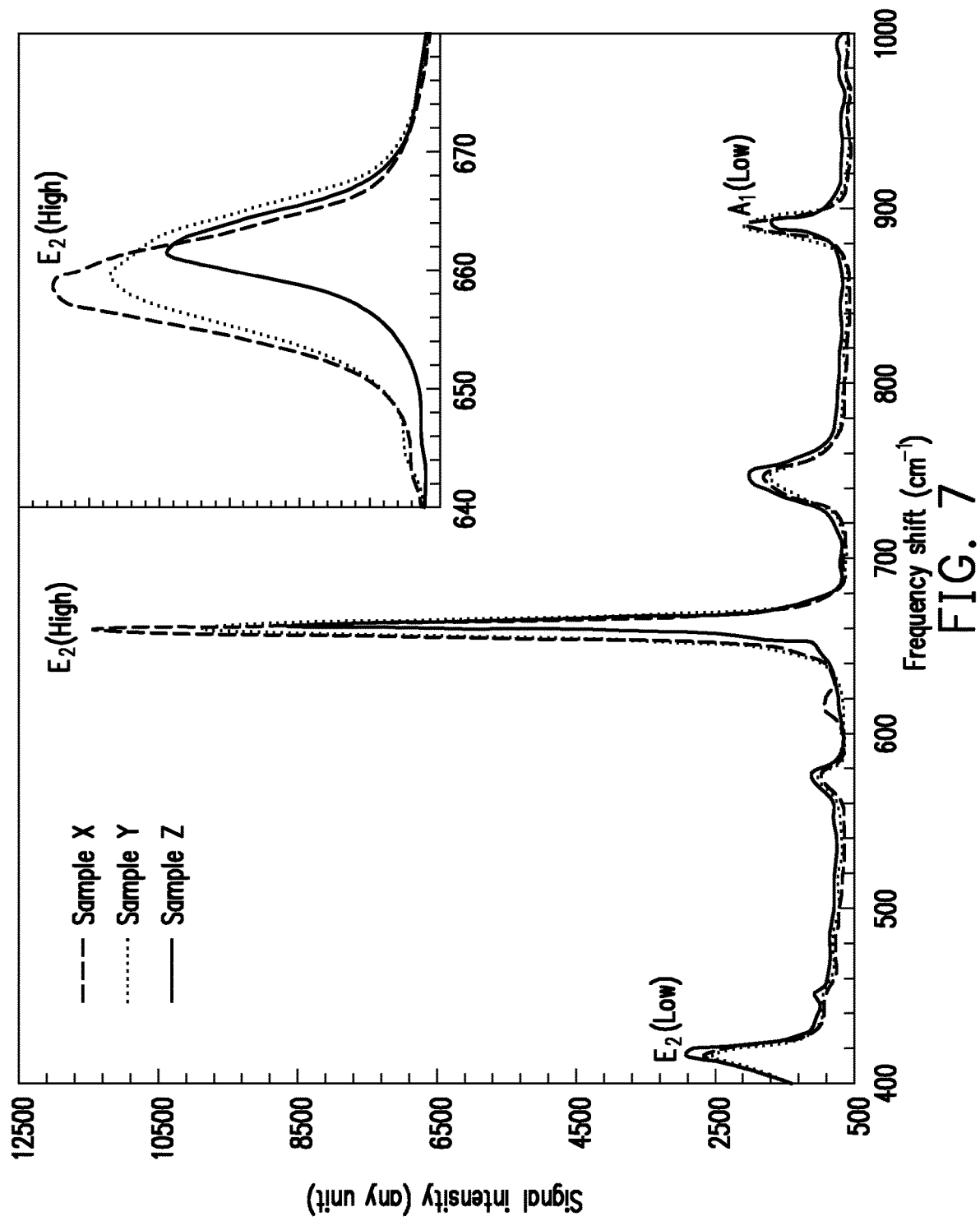
FIG. 7 is a Raman spectrogram of three different samples of a composite substrate after the growth of a second aluminum nitride layer.

FIG. 7 is a Raman spectrogram of three different samples after the growth of the second aluminum nitride layer 140. A sample X in FIG. 7 is that the first aluminum nitride layer 121 is formed on the substrate 110, but the first aluminum nitride layer 121 is not annealed, and the second aluminum nitride layer 140 without silicon is grown on the first aluminum nitride layer 121. A sample Y is that the first aluminum nitride layer 121 is formed on the substrate 110 and annealed, and the second aluminum nitride layer 140 without silicon is grown on the first aluminum nitride layer 121. A sample Z is that the first aluminum nitride layer 121 is formed on the substrate 110 and annealed, and the second aluminum nitride layer 140 with silicon is grown on the first aluminum nitride layer 121. The aluminum nitride layer 150 of the samples X, Y and Z in FIG. 7 are 2.11 μm, 2.12 μm and 2.13 μm in thickness, respectively, and the samples X, Y and Z in FIG. 7 have warpages of 20.3 μm, 60.8 μm and 46.4 μm, respectively, and E2 high modes of Raman spectrums of the samples X, Y and Z in FIG. 7 have frequency shifts of 658.9 cm$^{-1}$, 661.7 cm$^1$ and 659.6 cm$^{-1}$, respectively. In this embodiment, the frequency shift of the E2 high mode of Raman spectrum of the composite substrate 100 is less than or equal to 659.6 cm$^{-1}$. From the frequency shifts of the Raman spectrums, the values of the stress of the samples X, Y and Z in FIG. 7 can be correspondingly found according to documents to be −1 GPa, −1.96 GPa and −1.24 GPa, respectively, and the values of the stress of the samples X, Y and Z in FIG. 7 can be calculated according to the warpages as −0.54 GPa, −1.61 GPa and −1.22 GPa, respectively, by means of a Stoney equation. The negative value of the stress means the stress is compressive to distinguish from the tensile stress which has a positive value. The more the absolute value of the negative value of the stress is, the larger the compressive stress is. In this embodiment, the value of the residual stress of the composite substrate 100 is larger than or equal −1.24 GPa.

Figure 8:
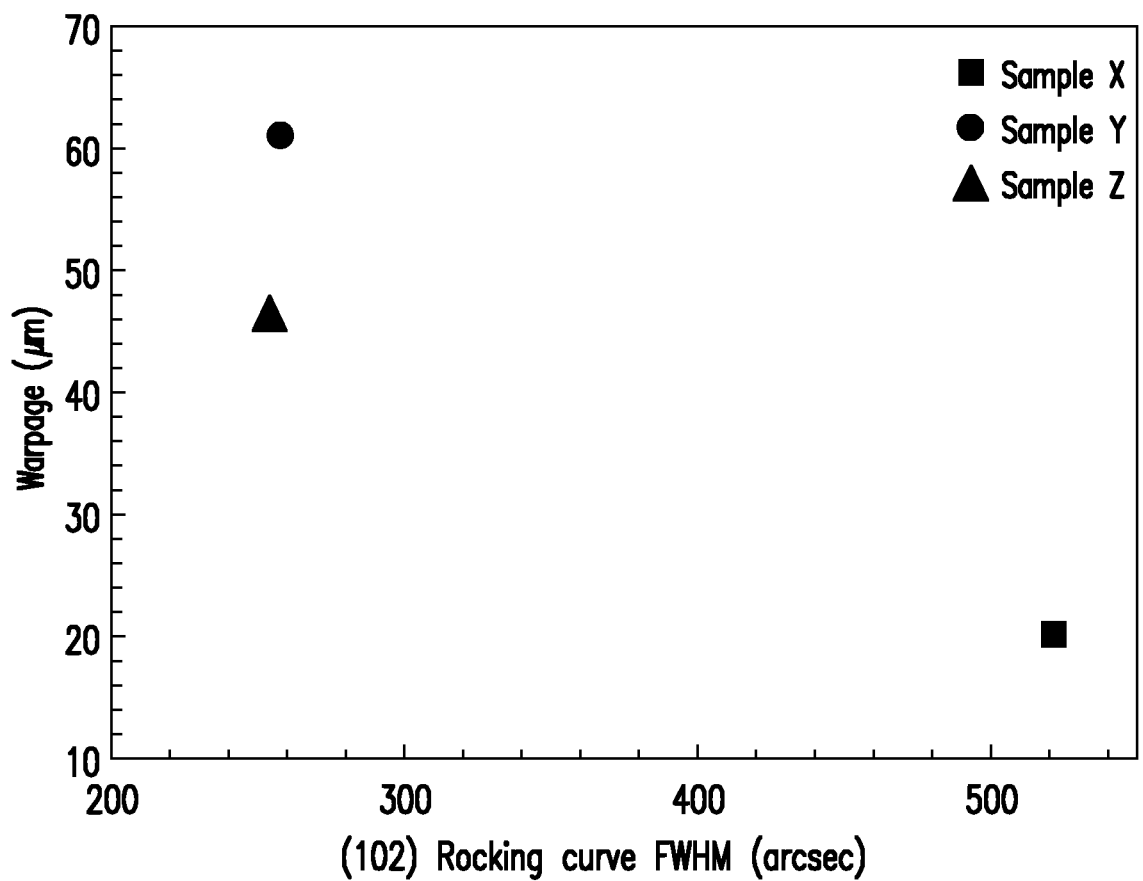
FIG. 8 is a diagram of (102) X-ray rocking curve FWHM (full width at half maximum) vs. warpage of three different samples of the composite substrate of FIG. 7 after the growth of a second aluminum nitride layer.

FIG. 8 is a diagram of (102) X-ray rocking curve FWHM vs. warpage of three different samples X, Y and Z of the composite substrate of FIG. 7 after the growth of the second aluminum nitride layer 140. The warpages of the samples X, Y, and Z in FIG. 8 are 20.3 μm, 60.8 μm, and 46.4 μm, respectively. After the second aluminum nitride layer 140 is formed on the sample X, the sample Y and the sample Z, the FWHMs of the (102) X-ray rocking curve are 521 arcsec, 259 arcsec, and 254 arcsec, respectively. It can be seen from the above experimental data that the high-temperature annealing effectively improves the crystal quality, but a residual thermal compression strain causes a large wafer warpage after the growth of the second aluminum nitride layer 140, and the method for doping the silicon into the second aluminum nitride layer 140 can balance this strain and maintain high crystal quality.

Figure 9:
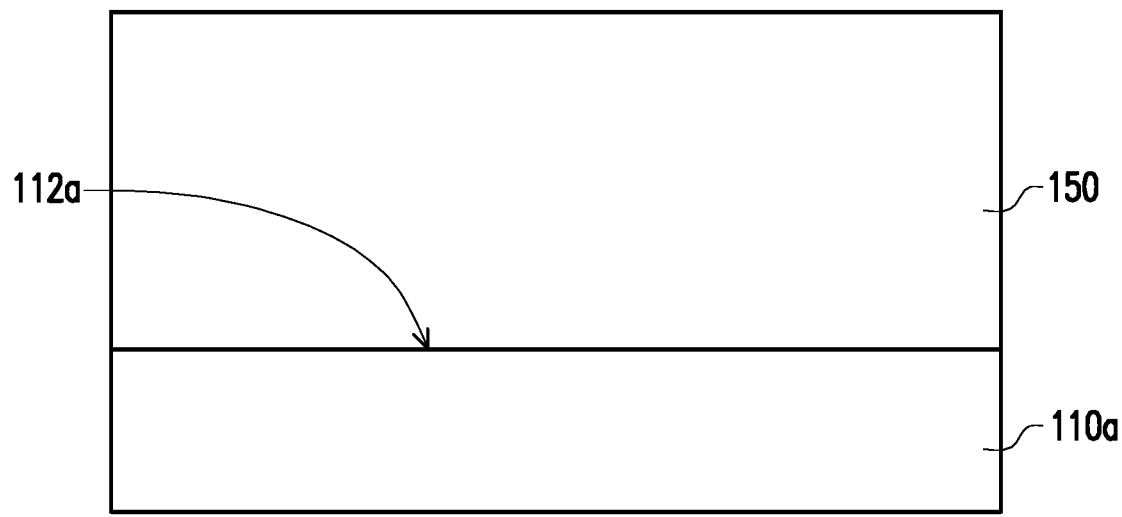
FIG. 9 is a cross-sectional diagram of a composite substrate according to another embodiment of the disclosure.

FIG. 9 is a cross-sectional diagram of a composite substrate according to another embodiment of the disclosure. Referring to FIG. 9, the composite substrate 100a of the present embodiment is similar to the composite substrate 100 of FIG. 5, but main differences between the two are as follows. A top surface 112a of the substrate 110a of the composite substrate 100a of the present embodiment is a flat surface without the nano-patterned recesses 114 of FIG. 5. In addition, the manufacturing method of the composite substrate 100a of the present embodiment is to form the aluminum nitride layer 150 directly on the top surface 112a of the substrate 110a, and the aluminum nitride layer 150 is doped with silicon to effectively regulate the residual stress. The material of the substrate 110a of the present embodiment is the same as that of the substrate 110 of FIG. 5, and the method for forming the aluminum nitride layer 150 of the present embodiment may be the MOCVD.

Based on the above, in the composite substrate and the manufacturing method thereof of the embodiments of the disclosure, since the plurality of nano-patterned recesses separated from each other are used on the top surface of the substrate, that is, a nano-patterned substrate having a recessed nano pattern is used to replace the traditional patterned substrate having the protruding nano pattern, thereby greatly reducing the intrinsic grain sewing difficulty of aluminum nitride epitaxy. In addition, in the present embodiment of the disclosure, the method for forming the nano-patterned recesses may be the wet etching method, which contributes to improving the quality of epitaxy directly formed on aluminum nitride. Furthermore, in the embodiments of the disclosure, by the method for forming the planarization layer and then gradually removing the material of the planarization layer, the surface of the first aluminum nitride layer is flattened, and by the annealing on the flattened first aluminum nitride layer, the crystal quality of the aluminum nitride layer can be further improved, the sewing difficulty can be reduced, and the design space of the composite substrate is expanded.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. A composite substrate, comprising:
   a substrate being a sapphire substrate; and
   an aluminum nitride layer, disposed on a top surface of the substrate, wherein silicon is doped in the aluminum nitride layer to regulate residual stress, a film thickness of the aluminum nitride layer is less than 3.5 µm, a defect density of the aluminum nitride layer is less than or equal to $5 \times 10^9/cm^2$, and a root mean square roughness of the top surface, facing away from the substrate, of the aluminum nitride layer is less than 3 nm, and wherein the aluminum nitride layer comprises a first aluminum nitride layer and a second aluminum nitride layer; the in-plane lattice constant of the second aluminum nitride layer is larger than the in-plane lattice constant of the first aluminum nitride layer because of the silicon doped in the second aluminum nitride layer; and the first aluminum nitride layer is disposed between the substrate and the second aluminum nitride layer.

2. The composite substrate according to claim 1, wherein the thickness of the first aluminum nitride layer is less than 600 nm.

3. The composite substrate according to claim 1, wherein a doping concentration of the silicon in the second aluminum nitride layer is more than $2 \times 10^{17}$ cm$^{-1}$ and less than $1 \times 10^{20}$ cm$^{-3}$.

4. The composite substrate according to claim 1, wherein a silicon concentration of the aluminum nitride layer at a side adjacent to the substrate is lower than a silicon concentration of the aluminum nitride layer at a side far away from the substrate.

5. The composite substrate according to claim 1, wherein the distance between the highest silicon concentration position in the aluminum nitride layer to the top surface of the substrate is higher than 600 nm in a vertical direction perpendicular to the substrate.

6. The composite substrate according to claim 1, wherein the top surface of the substrate comprises a plurality of nano-patterned recesses, and the plurality of nano-patterned recesses are separated from each other.

7. The composite substrate according to claim 6, wherein a full width at half maximum (FWHM) of a (002) X-ray rocking curve of the aluminum nitride layer is less than or equal to 216 arcsec.

8. The composite substrate according to claim 6, wherein a FWHM of a (102) X-ray rocking curve of the aluminum nitride layer is less than or equal to 400 arcsec.

9. The composite substrate according to claim 6, wherein a depth of the plurality of nano-patterned recesses is in a range of 150 nm to 1.5 µm, and a width of the plurality of nano-patterned recesses is in a range of 200 nm to 1.5 µm.

10. The composite substrate according to claim 6, wherein side walls of the plurality of nano-patterned recesses are of an inverted pyramid shape.

11. The composite substrate according to claim 1, wherein a frequency shift of an E2 high mode of Raman spectrum of the composite substrate is less than or equal to 659.6 cm$^{-1}$.

12. The composite substrate according to claim 1, wherein the value of the residual stress of the composite substrate is larger than or equal −1.24 GPa.

* * * * *